United States Patent [19]
Matsumoto

[11] Patent Number: 4,887,237
[45] Date of Patent: Dec. 12, 1989

[54] SEMICONDUCTOR MEMORY DEVICE

[75] Inventor: Tetsuro Matsumoto, Tachikawa, Japan

[73] Assignee: Hitachi, Ltd., Tokyo, Japan

[21] Appl. No.: 174,974

[22] Filed: Mar. 29, 1988

Related U.S. Application Data

[62] Division of Ser. No. 925,223, Oct. 31, 1986, Pat. No. 4,740,920, which is a division of Ser. No. 530,079, Sep. 7, 1983, Pat. No. 4,638,460.

[30] Foreign Application Priority Data

Sep. 22, 1982 [JP] Japan ................................ 57-163888

[51] Int. Cl.$^4$ ............................................ G11C 11/24
[52] U.S. Cl. ..................................... 365/182; 365/149; 365/184
[58] Field of Search ............... 365/149, 182, 184, 186, 365/150

[56] References Cited

U.S. PATENT DOCUMENTS 4,638,460 1/1987 Matsumoto .......................... 365/149
4,740,920 4/1988 Matsumoto .......................... 365/149

*Primary Examiner*—Terrell W. Fears
*Attorney, Agent, or Firm*—Antonelli, Terry & Wands

[57] ABSTRACT

A semiconductor memory device is provided with memory cells which each comprises an insulated gate type field effect transistor and a capacitor connected in series with one another and connected to bit lines. The capacitor is composed of a pair of electrodes and a dielectric film which includes a silicon nitride film existing between the pair of electrodes. One electrode of the capacitor is provided with a terminal to which a voltage is applied. The value of the applied voltage is chosen so that the voltage applied between the pair of electrodes is smaller in an absolute value than a voltage applied to the bit line.

12 Claims, 5 Drawing Sheets

SEMICONDUCTOR MEMORY DEVICE

This is a divisional of application Ser. No. 925,223, filed Oct. 31, 1986, now U.S. Pat. No. 4,740,920, which is a divisional of application Ser. No. 530,079, filed Sept. 7, 1983 now U.S. Pat. No. 4,638,460.

BACKGROUND OF THE INVENTION

The present invention relates to a semiconductor memory device, and more particularly to a semiconductor memory device having a one-transistor type memory cell in which one transistor and one capacitor are connected in series.

A dynamic type RAM (Random Access Memory) has recently been put into extensive practical use which employs a one-transistor type memory cell in which one insulated gate type field effect transistor (hereinbelow, simply termed "MISFET") and one capacitor are connected in series. A theme of the manufacturing technology of this dynamic RAM is to reduce to the utmost the area occupied by the capacitors of a large number of memory cells which are formed on a semiconductor substrate. As a solution for reducing the area occupied by the capacitors, high permittivity material has been tried for a dielectric material which consitutes the capacitors. Heretofore, a silicon oxide film has been common as the dielectric material put into practical use. It has been considered to replace this material with a silicon nitride film of high permittivity. Silicon nitride film has a permittivity which is about double that of silicon oxide film, and, because of this, a remarkable decrease in the occupied area relative to that of the conventional capacitor employing silicon oxide film can be expected.

As the result of experimental research, however, the inventor has discovered the problem that, when a capacitor is formed on the surface of a semiconductor substrate by employing a silicon nitride film as the dielectric material between the two electrodes of the capacitor, the surface state of the semiconductor substrate surface changes to vary the capacitance value of the capacitor, in accordance with the magnitude and polarity of a voltage applied across the electrodes. More specifically, the inventor's experimental research has revealed that, in a case where a silicon oxide film is formed on the surface of a semiconductor substrate and is further overlaid with a silicon nitride film so as to use both films as the dielectric film of a capacitor, unfavorable carriers are accumulated in a trap region formed in the dielectric film. The changes accumulate in accordance with the magnitude and polarity of an applied voltage, and they change the state of the semiconductor substrate surface. This causes the capacitance value of the capacitor to undesirably vary with time. The variation in the capacitance value of the capacitor forms the cause of affording a soft error or malfunction to a memory device, and results in limiting the lifetime during which the memory device performs normal operations.

SUMMARY OF THE INVENTION

The present invention has been made on the basis of the inventor's finding of the aforementioned problem of voltage-dependency involved when a dielectric film of high permittivity is used.

An object of the present invention is to prevent the deterioration of characteristics attributed to the voltage-dependency in a memory device having a memory cell in which a data storage capacitor is formed of a dielectric film having a high permittivity such as silicon nitride film.

According to the memory device of the present invention, a storage capacitor which is connected in series with a MISFET constituting a one-transistor type memory cell includes a silicon nitride film which is formed covering the surface of a predetermined region of a semiconductor substrate, and a conductive layer which is formed covering the silicon nitride film and to which a terminal for applying a voltage lower than a voltage to be applied to a bit line (or data line) is connected.

The above and other objects as well as the advantages of the invention will become apparent from the following description of preferred embodiments taken in conjunction with the accompanying drawings.

DESCRIPTION OF THE PREFERRED EMBODIMENTS

Figure 1:
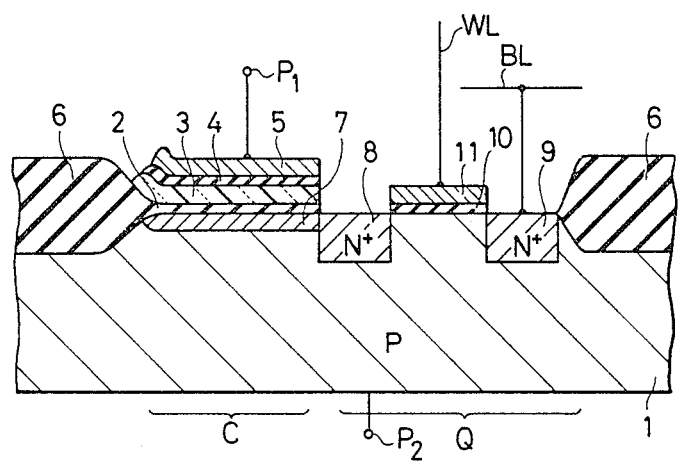
FIG. 1 is a sectional view showing the structure of a memory cell according to the present invention.
Figure 2:
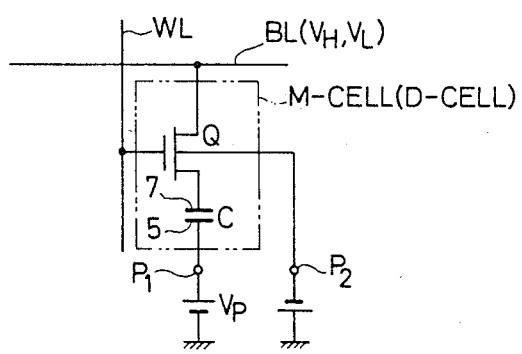
FIG. 2 is an equivalent circuit diagram of the memory cell shown in FIG. 1.

FIGS. 1 and 2 show an embodiment of a dynamic RAM according to the present invention wherein a series circuit consisting of a switching MISFET and a storage capacitor is formed as a memory cell on a semiconductor substrate. First, a memory cell portion according to the present invention will be described with reference to FIG. 1.

In the figure, letter C designates a part where the storage capacitor of the memory cell is formed, and letter Q designates a part where the switching N-channel MISFET connected in series with the capacitor C is formed. The switching MISFET Q includes a thin gate insulator film 10 which is formed on the major surface of a P-type semiconductor substrate 1, and a gate electrode layer 11 which is formed thereon. A P-type single crystal silicon substrate having, e.g., the (100) plane surface is used as the substrate 1, and a silicon oxide ($SiO_2$) film can be used as the gate insulator film 10. In addition, a polycrystalline silicon film is used as the gate electrode 11. In the substrate 1, $N^+$-type semiconductor regions 8 and 9 are formed so as to define the channel region of the MISFET. Both these regions operate as source and drain regions, or drain and source regions.

The capacitor portion C has an $N^+$-type semiconductor region 7 which is formed continuously to the semiconductor region 8 operating as the drain or source region. This region 7 has a predetermined occupying area in accordance with a capacitance value required of the capacitor, and forms one electrode of the capacitor.

A thin silicon oxide film 2 is formed on the region 7. This silicon oxide film 2 is intended to relieve a stress on the substrate surface ascribable to the difference of the coefficients of thermal expansion of a silicon nitride (Si₃N₄) film to be formed thereon and the substrate 1, thereby to prevent crystal defects from developing.

On the silicon oxide film 2, the silicon nitride film 3 is formed in accordance with the present invention. Further, a thin silicon oxide film 4 is formed on the silicon nitride film 3, and the counter electrode 5 of the capacitor is formed of polycrystalline silicon thereon. The counter electrode 5 opposes to the region 7, and has an occupying area substantially equal to that of the latter. This electrode 5 may well be formed integrally with a wiring lead which extends on the semiconductor substrate. A thick silicon oxide film (field silicon oxide film) 6 is formed between the cell forming regions.

In this structure, the silicon nitride film 3 having a high permittivity is employed as the dielectric film of the capacitor, so that area occupied by the capacitor forming portion C can be reduced. In the present invention, the silicon nitride film may well be formed directly on the substrate 1. As described above, however, when the silicon nitride film is formed directly on the surface of the Si substrate 1, the difference of the coefficients of thermal expansion of the Si substrate and the silicon nitride film incurs a thermal strain in the surface of the Si substrate 1 and brings about crystal defects therein. It is therefore preferable to form the silicon nitride (Si₃N₄) film through the SiO₂ film. Moreover, in the case where the SiO₂ film is not interposed, the interface characteristics become unstable, and quantitatively, the flat band voltage $V_{FB}$ is changed to cause variation-with-time in the capacitance (C)—voltage (V) characteristic. Furthermore, a leakage current takes place, and the breakdown voltage degrades. It is therefore favorable to form the Si₃N₄ film through the SiO₂ film.

In the foregoing memory cell device, a terminal $P_1$ is connected to the electrode 5 of the capacitor in accordance with the present invention. A specified voltage $V_P$ is applied through this terminal $P_1$. As illustrated in FIG. 2, the voltage $V_P$ is determined according to a voltage which is applied to a bit line (data line) BL with the memory cell connected thereto, in correspondence with the logic level "1" or "0" of data. Letting $V_H$ denote the voltage of the logic "1" to be applied to the bit line BL, and $V_L$ denote the voltage of the logic "0", the voltage $V_P$ is set at the relationship of $V_L < V_P < V_H$. In particular, to the end of applying equal voltages for both the positive and negative signs of a voltage which is applied to the semiconductor substrate electrode 7 of the capacitor C, the voltage $V_P$ should desirably be set at $$V_P = \frac{V_H + V_L}{2}.$$

By way of example, when the voltage of the bit line BL changes between $V_H = +5$ V and $V_L = 0$ V, it is desirable to set $V_P = +2.5$ V. In the case of setting $V_P = +2.5$ V, a voltage $V_S$ which is applied across both the electrodes (5, 7) of the capacitor at $V_H = +5$ V becomes $+2.5$ V, so that the substrate electrode is positively biased with respect to the electrode 5. Conversely, the voltage $V_S$ applied across both the electrodes of the capacitor at $V_H = 0$ V becomes $-2.5$ V, so that the substrate electrode 7 is negatively biased with respect to the electrode 5.

In this manner, a feature according to the present invention consists in that the voltage $V_S$ to be applied across both the electrodes (5, 7) of the capacitor C (hereinbelow, this voltage shall be termed the "stress voltage") is rendered as small as possible for the voltages of both the positive and negative signs. The reason therefor will be clarified from the ensuing description.

First, the inventor has found out that the following phenomenon arises in the capacitor C which uses the silicon nitride film as the dielectric film.

Figure 3:
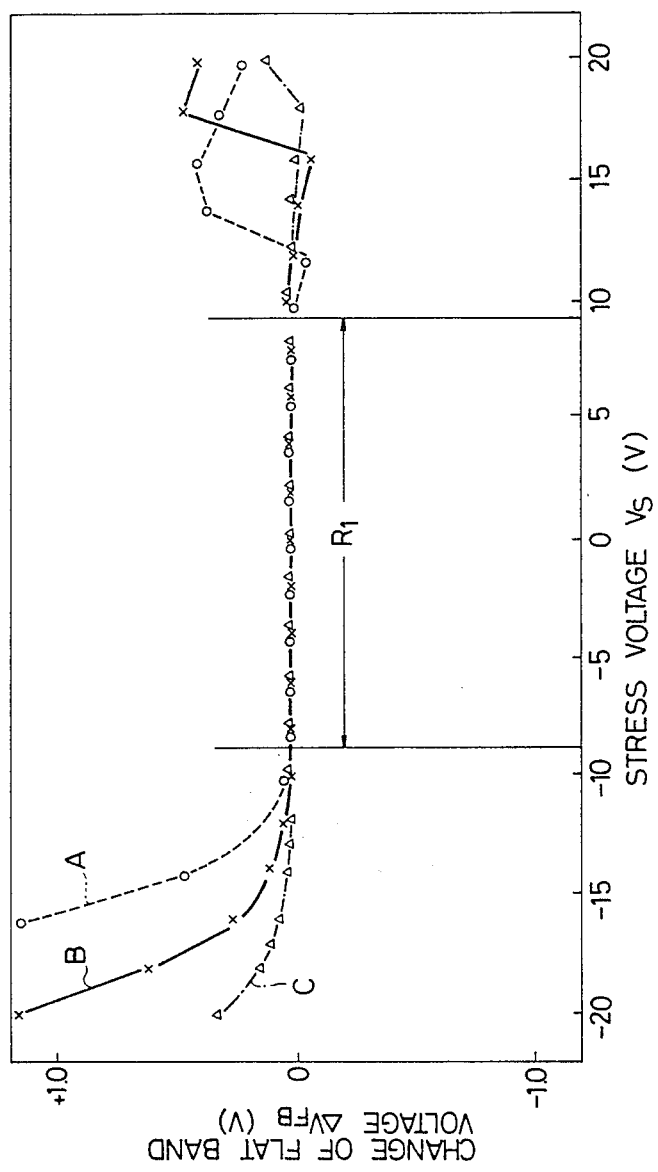
FIG. 3 is a graph showing the relationship between the stress voltage $V_S$ and the change $\Delta V_{FB}$ of the flat band voltage for a capacitor such as shown in FIG. 1.

FIG. 3 is a graph showing the result of an experiment which was conducted on the relationship between the stress voltage $V_S$ (V) and a flat band voltage $V_{FB}$ (V) which serves as an indicator for a surface charge state. The test was conducted using a capacitor structure constructed along the lines shown for the capacitor C shown by the embodiment of FIG. 1, with an Si substrate having successively formed thereon an SiO₂ film, an Si₃N₄ film, an SiO₂ film and a polycrystalline silicon layer. The positive stress voltage $V_S$ denotes that the semiconductor substrate electrode 7 becomes a positive voltage with respect to the electrode 5, whereas the negative stress voltage $V_S$ denotes that the substrate electrode 7 becomes a negative voltage with respect to the electrode 5.

As conditions in the experimental study, the thickness of the silicon nitride film 3 was 180 Å, and that of the uppermost silicon oxide film 4 was 20 Å. Further, the thickness of the lowermost silicon oxide film 2 was changed for purposes of the experiment to have values of 110 Å, 150 Å and 210 Å. The stress voltage $V_S$ was applied at the room temperature for 1 minute. Curves A, B and C in FIG. 3 correspond to samples in which the lowermost silicon oxide films (SiO₂) were 110 Å, 150 Å and 210 Å thick, respectively.

As illustrated in FIG. 3, within a range $R_1$, even when the stress voltage $V_S$ changes, the flat band voltage $V_{FB}$ does not change and becomes flat. In contrast, the inventor's experiments found that the flat band voltage $V_{FB}$ varies for higher stress voltages $V_S$, and it goes from the flat state in range $R_1$ to a rise state outside the range $R_1$.

Figure 4:
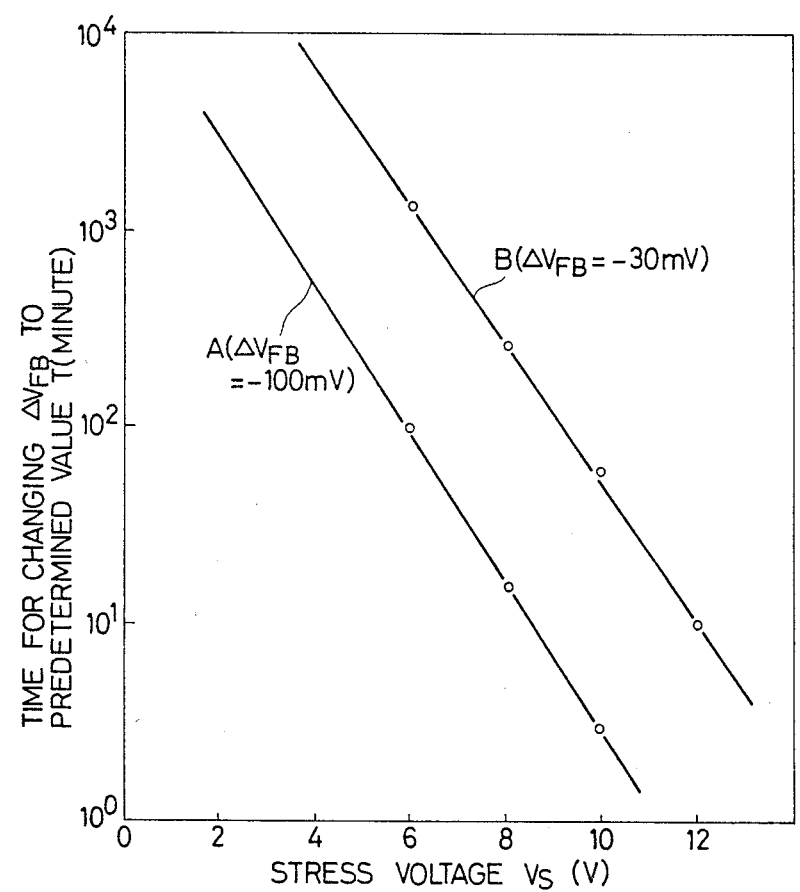
FIG. 4 is a graph showing the relationship between the stress voltage $V_S$ and the time T for changing $\Delta V_{FB}$ by a predetermined value for a capacitor such as shown in FIG. 1.

Upon further studying this phenomenon, the inventor observed at a measurement temperature of 125° C. the relationship between the positive stress voltage $V_S$ (V) and the period of time T (minute) in which the flat band voltage $V_{FB}$ changes by predetermined values $\Delta V_{FB}$ (here, 30 mV and 100 mV). FIG. 4 illustrates the variations of $V_{FB}$ depending upon the stress voltage $V_S$. A straight line A in FIG. 4 has been obtained by plotting the periods of time in which $\Delta V_{FB}$ became $-30$ mV, and a straight line B by plotting the periods of time in which $\Delta V_{FB}$ became $-100$ mV, in relation to the stress voltage $V_S$.

It is seen from FIG. 4 that, with increase in the stress voltage $V_S$, the period of time in which $\Delta V_{FB}$ changes the predetermined value shortens. It has accordingly been recognized from FIG. 4 that, in a capacitor employing silicon nitride film as the insulating film, as in the present invention, the operation with a lower stress voltage or lower applied voltage changes the surface state less.

The reason will be as stated below. In a case of using the silicon nitride film, a region (trap level) which traps charges is formed in the Si₃N₄ film, and the charges are stored at the trap level by the applied voltage, so that the surface state of the semiconductor substrate constituting the capacitor changes. The change of $V_{FB}$ results in the change of the capacitance value of the capacitor. This change varies greatly in accordance with the time of application of the stress voltage $V_S$. In consequence, a great capacitance change is exhibited with respect to a predetermined initial value, and the function of the structure as the capacitor of the memory cell is ruined. Basically, the cause for this is believed to be that the stored charges of the trap level will change with the lapse of time. The variation of the capacitance value, namely, the variation $\Delta V_{FB}$ becomes greater as the stress voltage is larger, as shown in FIG. 4.

As revealed from the above results illustrated in FIGS. 3 and 4, the function of the structure of FIG. 1 as a memory cell can be maintained for a longer time if the stress voltage applied across both the electrodes of the capacitor has a smaller value.

The present invention has been made on the basis of the above-discussed facts. In principle, the subject matter is that voltages for the capacitor C in both the polarities are held to the smallest possible applied voltages. That is, when the voltage $V_P$ (memory cell electrode voltage) to be applied to one electrode of the capacitor C via the terminal $P_1$ is set at the relationship of $V_L < V_P < V_H$ as described before, the voltage $V_S$ to be applied across the capacitor can be rendered small for the voltages of both the polarities.

Especially in the case of setting the voltage $V_P$ at $$V_P = \frac{V_L + V_H}{2},$$

equal voltages can be applied for the voltages of both the polarities.

Consider by way of example that, in case of operating the memory device, the high level ("1" level) $V_H$ of the bit line BL is 5 V, while the low level ("0" level) $V_L$ is 0 V. Then, in the case where the memory cell electrode voltage $V_P$ has been set at $$\frac{V_L + V_H}{2} = 2.5 \text{ V},$$

the stress voltage $V_S$ of the capacitor C can be reduced to have an absolute value of 2.5 V as indicated in the following table:

| LOGIC LEVEL | $V_P = +2.5$ V |
|---|---|
| $V_H = +5$ V | $V_S = +2.5$ V |
| $V_L = 0$ V | $V_S = -2.5$ V |

While, in the above, the memory cell electrode voltage $V_P$ has been exemplified as being halved, this applied voltage $V_P$ may be selected on the basis of a supply voltage (which substantially determines the $V_H$ level). For example, in case of setting $V_P$ at $+1$ V, $V_S$ can be limited within a range of $-1$ to $+4$ V, and in case of setting $V_P$ at $+4$ V, $V_S$ can be limited within a range of $-4$ V to $+1$ V. The stress voltage may be selected within the range $R_1$ shown in FIG. 3 within which $\Delta V_{FB}$ does not rise, and the voltage $V_P$ may be set at a voltage level intermediate between the high and low logic levels.

As one aspect thereof, the present invention provides a practical capacitor which employs silicon nitride film as the dielectric film. In general, however, the present invention is applicable to a dielectric film having the so-called voltage-dependency which renders the surface state of a semiconductor substrate surface unstable, depending upon the magnitude of a voltage or the direction of an electric field. According to the present invention, the electric field of the capacitor portion of a memory cell is optimized, whereby enhancement in the reliability and enhancement in the breakdown voltage can be achieved. Further, according to the present invention, the capacitance electrodes of a one-transistor type RAM can be rendered smaller, which is effective for enlarging the capacity of the one-transistor type RAM.

Figure 5:
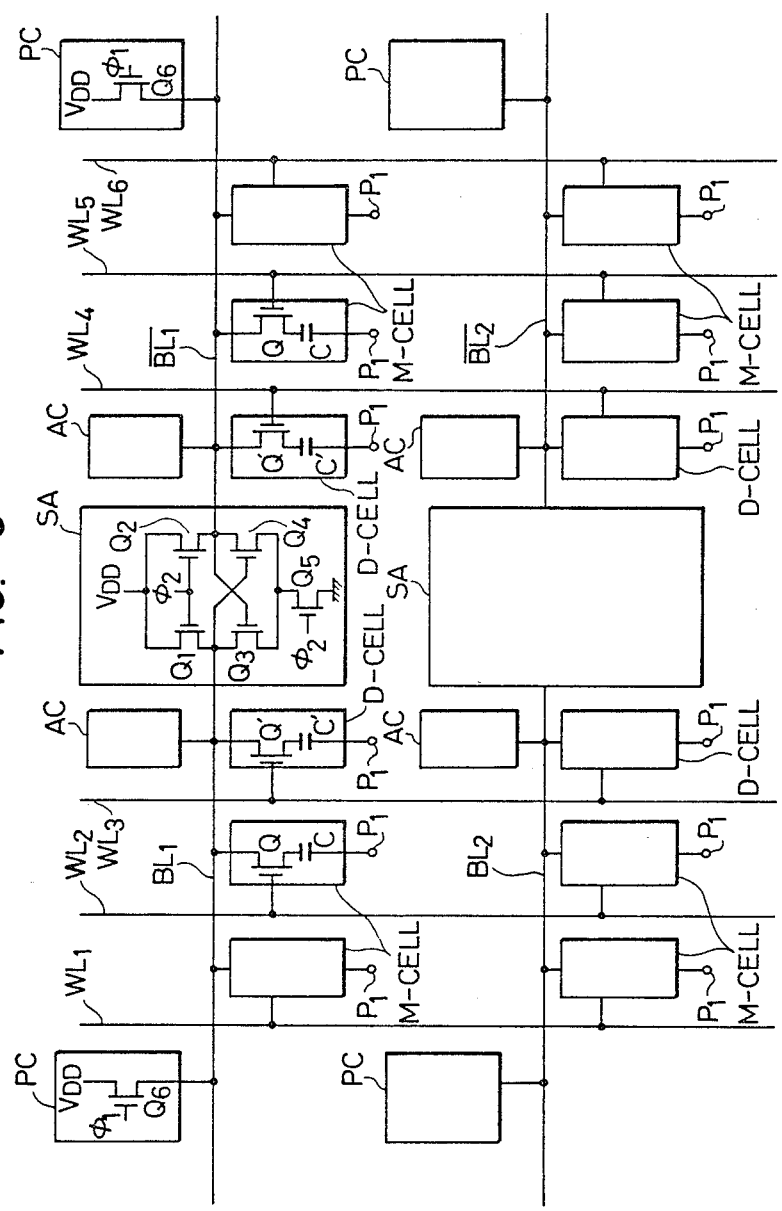
FIG. 5 is a circuit diagram showing a memory device according to the present invention.

FIG. 5 shows a circuit diagram of the semiconductor memory device of the present invention constructed on a single semiconductor substrate by employing the memory cells described above. In FIG. 5, M-CELL denotes the foregoing memory cell portion. The memory cells are arrayed in the shape of a matrix. SA denotes a sense circuit, which is composed of N-channel MISFETs $Q_1$–$Q_5$. $\phi_2$ indicates a control pulse signal, which controls the sense circuit SA. Each sense circuit is coupled to one pair of adjoining bit lines $BL_1$ and $\overline{BL_1}$ ($BL_2$ and $\overline{BL_2}$). D-CELL indicates a dummy cell which is coupled to each bit line, and which is composed of a MISFET Q' and a capacitor C' similarly to the memory cell. However, the capacitance value of the capacitor C' of the dummy cell D-CELL is set at about $\frac{1}{2}$ of that of the capacitor C of the memory cell M-CELL. The capacitor C' can be formed by the same structure as that of the capacitor C of the memory cell described above.

$WL_1$–$WL_6$ indicate word lines, which are coupled to the memory cells or dummy cells arrayed in the respective rows.

AC indicates an active restore circuit, and PC a precharge circuit constructed of an N-channel MISFET $Q_6$ which is driven by a control signal $\phi_1$.

In this circuit arrangement, a supply voltage $V_{DD}$ is set at $+5$ V by way of example. Since the supply voltage $V_{DD}$ substantially specifies the high level $V_H$ of the logic levels of the bit line BL to $+5$ V, the voltage $V_P$ to be impressed on the terminal $P_1$ is set at $+2.5$ V, to reduce the stress voltage $V_S$ of the capacitor C or C' as stated before.

The terminal $P_1$ serves to supply the external voltage $V_P$ for reducing the impression of the stress voltage $V_S$ on the capacitor. Specifically, the terminal $P_1$ of the capacitors C and C' arranged in the matrix form are connected in common and to a power supply $V_P$ (not shown). Wiring for interconnecting the terminals $P_1$ can be formed by a polycrystalline silicon layer at an identical level so as to continuously extend from the polysilicon layer 5 (FIG. 1) which forms one electrode of each of the capacitors C and C'.

Figure 6:
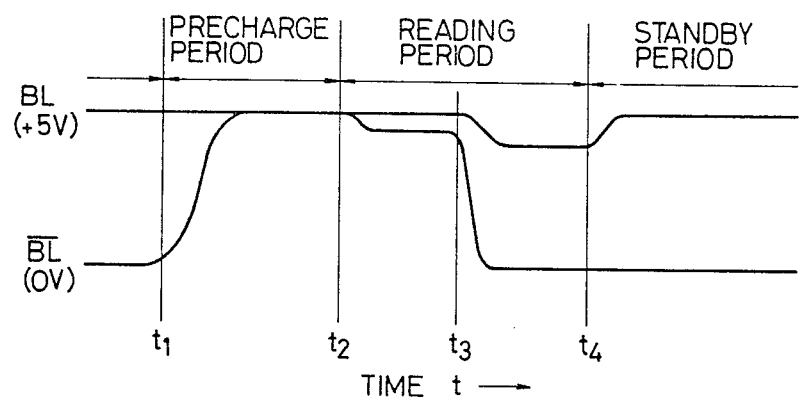
FIG. 6 is a graph for explaining the operations of the circuit shown in FIG. 5.

FIG. 6 is an operating waveform diagram which illustrates the operations of the memory device shown in FIG. 5. In FIG. 6, $t_1$ indicates the point of time at which the precharge circuit PC operates, and $t_2$ the point of time at which a pair of predetermined word lines WL are selected to operate a specified memory cell M-CELL and a dummy cell D-CELL corresponding thereto. Further, $t_3$ indicates the point of time at which the amplifying operation of the sense circuit SA is started, and $t_4$ the point of time at which the active restore circuit AC operates. As is apparent from these operations, the pair of bit lines BL and $\overline{BL}$ have their voltage levels changed complementarily, so that terminal voltages $V_S$ of signs opposite to each other are applied to the respective capacitors C and C' of the memory cell and the dummy cell.

Since, at this time, the voltage (2.5 V) equal to $\frac{1}{2}$ of 5 V being the high level of the bit lines is applied to one end of each of the capacitors C and C' through the terminal $P_1$ as described before, the voltage applied across the electrodes of each capacitor has an absolute value of 2.5 V. Accordingly, the variation-with-time of the capacitors can be effectively prevented.

The present invention is not restricted to the foregoing embodiments, but various alterations are possible within a scope of the following claims without departing from the spirit of the invention.

I claim:

1. A semiconductor memory device comprising:
   a dynamic memory cell which includes a series connection comprising a switching MISFET and a storage capacitor connected in series, said storage capacitor comprising a first electrode, a silicon nitride film, and a second electrode;
   a bit line which is connected to one of said series connection;
   amplifier means which is coupled to said bit line and which supplies a signal having one level of a predetermined high level and a predetermined low level to said bit line;
   a first terminal which is coupled to said amplifier means and which is supplied with a first reference voltage having a first level substantially identical with said predetermined high level;
   a second terminal which is coupled to said amplifier means and which is supplied with a second reference voltage having a second level substantially identical with said predetermined low level; and
   a third terminal which is connected to the other end of said series connection and which supplies a voltage which is greater than said second level but less than said first level to said other end of said series connection so that a voltage of said storage capacitor to be stored between said first electrode and said second electrode has a smaller absolute value than an absolute value of said first level,
   wherein said switching MISFET has a region connected to said second electrode of said storage capacitor and a region connected to said bit line, and wherein said first electrode of said storage capacitor is connected to said third terminal.

2. A semiconductor memory device according to claim 1, wherein said first electrode is formed over said silicon nitride film and said silicon nitride film is formed over said second electrode.

3. A semiconductor memory device according to claim 2, wherein said amplifier means includes means for generating said signal having either said predetermined high level or said predetermined low level in accordance with data stored in said dynamic memory cell.

4. A semiconductor memory device according to claim 3, further comprising a silicon oxide film formed between said first electrode and said silicon nitride film.

5. A semiconductor memory device according to claim 4, further comprising a silicon oxide film formed between said second electrode and said silicon nitride film.

6. A semiconductor memory device according to claim 3, further comprising a silicon oxide film formed between said second electrode and said silicon nitride film.

7. A semiconductor memory device according to claim 1, wherein said first electrode is formed over said silicon nitride film and said silicon nitride film is formed over said second electrode.

8. A semiconductor memory device according to claim 7, further comprising a silicon oxide film formed between said first electrode and said silicon nitride film.

9. A semiconductor memory device according to claim 7, further comprising a silicon oxide film formed between said second electrode and said silicon nitride film.

10. A semiconductor device comprising:
    a dynamic memory cell which includes a series connection comprising a switching MISFET and a storage capacitor connected in series, said storage capacitor comprising a first electrode, a silicon nitride film, and a second electrode;
    a first silicon oxide film formed between said first electrode and said silicon nitride film;
    a second silicon oxide film formed between said second electrode and said silicon nitride film;
    a bit line which is connected to one end of said series connection;
    amplifier means which is coupled to said bit line and which supplies a signal having one level of a predetermined high level and a predetermined low level to said bit line;
    a first terminal which is coupled to said amplifier means and which is supplied with a first reference voltage having a first level substantially identical with said predetermined high level;
    a second terminal which is coupled to said amplifier means and which is supplied with a second reference voltage having a second level substantially identical with said predetermined low level; and
    a third terminal which is connected to the other end of said series connection and which supplies a voltage which is greater than said second level but less than said first level to said other end of said series connection so that a voltage of said storage capacitor to be stored between said first electrode and said second electrode has a smaller absolute value than an absolute value of said first level.
    wherein said switching MISFET has a region connected to said second electrode of said storage capacitor and a region connected to said bit line, and wherein said first electrode or said storage capacitor is connected to said third terminal.

11. A semiconductor memory device according to claim 10, wherein said amplifier means includes means for generating said signal having either said predetermined high level or said predetermined low level in accordance with data stored in said dynamic memory cell.

12. A semiconductor memory device comprising:
    a dynamic memory cell which includes a series connection comprising a switching MISFET and a storage capacitor connected in series, said storage capacitor comprising a first electrode, a silicon nitride film, and a second electrode, wherein said first electrode is formed over said silicon nitride film and said silicon nitride film is formed over said second electrode;
    a first silicon oxide film formed between said first electrode and said silicon nitride film;
    a second silicon oxide film formed between said second electrode and said silicon nitride film;
    a bit line which is connected to one end of said series connection;
    amplifier means which is coupled to said bit line and which supplies a signal having one level of a predetermined high level and a predetermined low level to said bit line;

a first terminal which is coupled to said amplifier means and which is supplied with a first reference voltage having a first level substantially identical with said predetermined high level;

a second terminal which is coupled to said amplifier means and which is supplied with a second reference voltage having a second level substantially identical with said predetermined low level; and a third terminal which is connected to the other end of said series connection and which supplies a voltage which is greater than said second level but less than said first level to said other end of said series connection so that a voltage of said storage capacitor to be stored between said first electrode and said second electrode has a smaller absolute value than an absolute value of said first level, wherein said switching MISFET has a region connected to said second electrode of said storage capacitor and a region connected to said bit line, and wherein said first electrode of said storage capacitor is connected to said third terminal.

* * * * *